United States Patent [19]

Pflasterer

[11] 3,824,475

[45] July 16, 1974

[54] SCANNING RADIO RECEIVER

[75] Inventor: Peter W. Pflasterer, Oak Ridge, Tenn.

[73] Assignee: Tennelec, Inc., Oak Ridge, Tenn.

[22] Filed: Feb. 1, 1973

[21] Appl. No.: 328,663

[52] U.S. Cl.................. 325/470, 325/459, 325/460, 331/76, 334/18

[51] Int. Cl.............................................. H04b 1/34

[58] Field of Search........... 325/459, 460, 462, 465, 325/468–470, 471; 334/18; 331/76

[56] References Cited

UNITED STATES PATENTS

| | | | |
|---|---|---|---|
| 3,241,072 | 10/1962 | Brand | 325/459 |
| 3,624,515 | 11/1971 | Rezek et al. | 325/462 |
| 3,654,557 | 4/1972 | Sakamoto et al. | 325/468 |
| 3,665,318 | 5/1972 | Hoffman et al. | 325/470 |
| 3,714,580 | 1/1973 | Close | 325/470 |
| 3,714,585 | 1/1973 | Koch | 325/468 |

*Primary Examiner*—Albert J. Mayer
*Attorney, Agent, or Firm*—Fitch, Even, Tabin & Luedeka

[57] ABSTRACT

A signal-seeking receiver automatically scans a plurality of channels of respective predetermined radio frequencies lying in a multiplicity of frequency bands. The channels are tuned in successively by successively coupling respective tuning crystals into the tuning circuit of a signal generator which produces the beating signals for heterodyning. Scanning is stopped upon receiving a signal. For higher bands the frequency of a basic oscillator is multiplied by cascaded frequency-multiplying circuits. Automatic frequency control is provided for channels in the highest band, with gating means for disabling the frequency control in the absence of a received signal. For bypassing selected channels during scanning, the clock driving the scanner is speeded up when the channels to be bypassed would otherwise be turned in.

7 Claims, 4 Drawing Figures

SCANNING RADIO RECEIVER

This invention relates generally to signal-seeking receivers and more particularly signal-seeking radio receivers which automatically scan a predetermined plurality of frequencies sequentially and automatically stop at a receiving channel. Still more particularly, the invention relates to such signal-seeking receivers wherein the predetermined frequencies are in a multiplicity of separate limited frequency bands. The invention also relates to such signal-seeking radio receivers wherein particular channels may be skipped in the sequencing.

Scanning radio receivers are well known for use in monitoring a plurality of transmission channels. It has been found convenient to monitor only certain selected discrete channels of most interest. To this end, it is known to provide a crystal oscillator with means for introducing a respective crystal into the tuning circuit of the oscillator for each selected channel or station. In a superheterodyne receiver the oscillator output beats against the received signal to tune in the respective channels or stations.

In the present invention a clock circuit produces clock pulses which actuate a sequential switching circuit which in turn puts out switching signals for successively and sequentially placing respective tuning crystals into the tuning circuit of the oscillator, at the same time activating a band switch for turning on the RF or receiving section for the band for the station selected. More particularly, in accordance with the present invention three bands are provided, namely, low and high VHF bands and a UHF band. The low VHF band may be in the range of 30–50 MHz, the high VHF band in the range of 145–175 MHz, and the UHF band in the range of 450–470 MHz, these being the frequencies assigned to broadcasts of particular interest.

In multiband radio receivers a separate RF section comprising an RF amplifier and a mixer circuit is provided for each band. A band switch turns on the respective RF section for the band encompassing the selected frequency. In the circuit of the present invention the low VHF band switch applies the oscillator output to an operating low band mixer, producing a beat frequency which is then further processed to produce an audio signal. In the case of a frequency in the high VHF band, it is convenient to utilize a crystal oscillating at a relatively low frequency. Therefore, upon actuation of the high VHF band switch, a harmonic of that frequency is produced and introduced into the high VHF band mixer for heterodyning. In the case of a UHF channel, a still higher harmonic is utilized. In the case of the preferred embodiment of the present invention, the band switches turn on respective frequency-multiplying circuits which produce third and ninth harmonic beating signals for heterodyning. Automatic frequency control is provided on the UHF band.

The plurality of channels is preselected by providing a particular crystal for each channel oscillating at such frequency as to tune in the desired station or frequency. In the event that it is desired to monitor only a few of the predetermined frequencies, means are provided for skipping particular channels. Not only are the channels passed, but in passing the channels, the clock is speeded up to cause the sequential scanning to proceed more rapidly.

It is therefore an object of the invention to provide a multiband scanning receiver, particularly one in which higher frequencies are tuned by utilization of successive frequency-multiplying circuits. It is a further object of the invention to provide such a receiver wherein an automatic frequency control circuit controls the frequency of the oscillator, at least for the highest band. It is a further object of the invention to provide means for skipping channels in a scanning radio receiver and for speeding up the operation of the scanning upon skipping a channel.

Other objects and advantages of the present invention will become apparent from the following detailed description particularly when taken in conjunction with the accompanying drawings in which.

Figure 1:
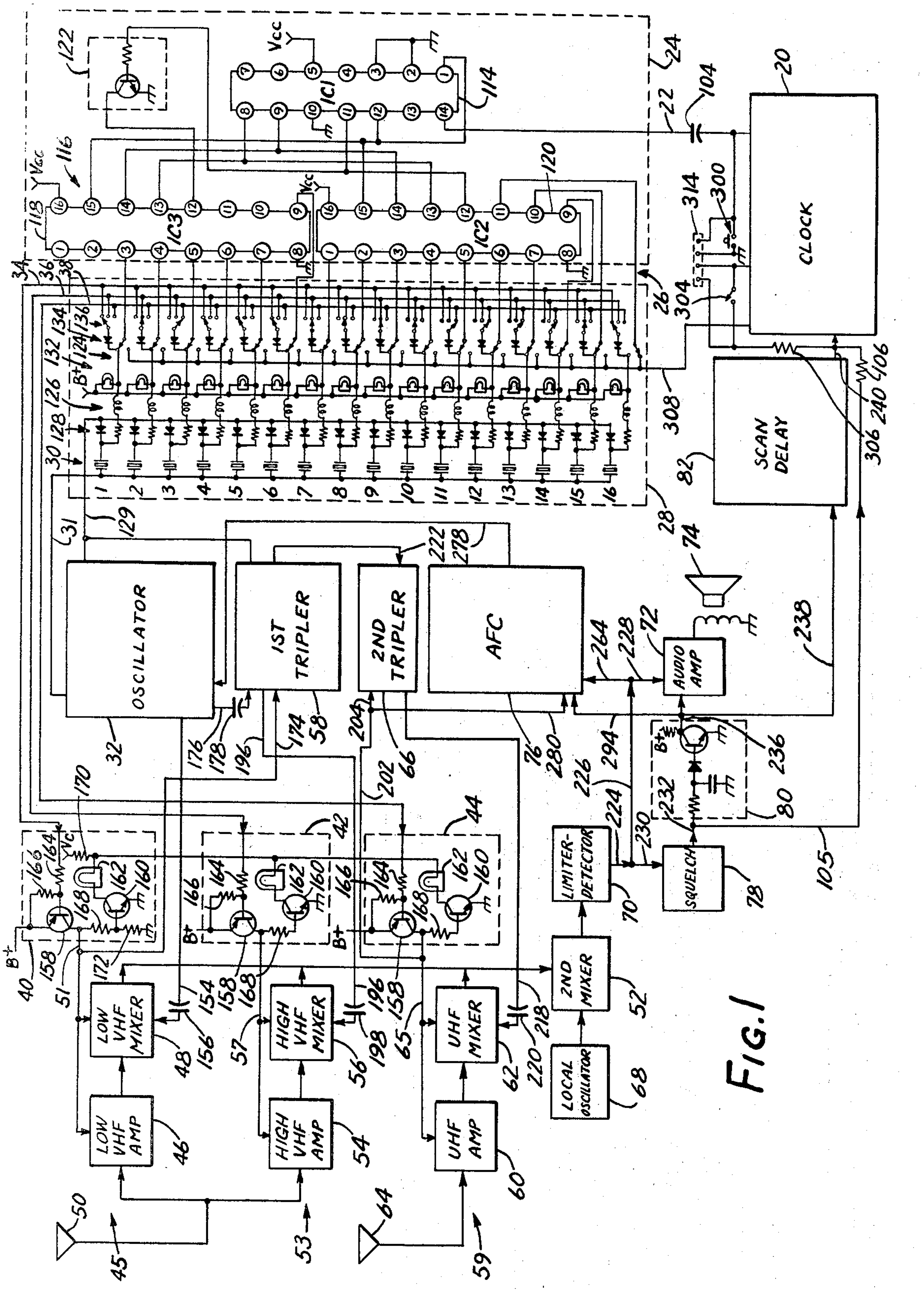
FIG. 1 is a diagrammatic illustration of the scanning radio receiver of the present invention.

A preferred embodiment of the scanning receiver of the present invention is illustrated in the drawings. The entire receiver is illustrated in FIG. 1, with certain component circuits illustrated in block form. The circuits of certain of these blocks are shown in greater detail in the other figures. As shown particularly in FIG. 1, a pulse generator or clock 20 produces timing or clock pulses over a conductor 22 to a sequential switching circuit 24 which generates channel-switching signals sequentially on its respective output leads 26. These output leads are connected to respective channels 1–16 of a crystal-switching array 28. Each channel of the switching array 28 includes a respective tuning crystal 30. The occurrence of a channel-switching signal on an output lead 26 connects the tuning crystal 30 of the respective channel by way of a conductor 31 into the tuning circuit of a crystal oscillator 32. The oscillator 32 thereupon operates at a frequency corresponding to the selected channel. At the same time, the signal on the particular output lead 26 produces a band-switching signal on a preselected one of conductors 34, 36 and 38 which are connected respectively to band switches 40, 42 and 44. The band-switching signal turns on a respective one of the band switches.

There is a separate RF section 45, 53 and 59 for each band which is activated by a respective band switch. The low VHF band RF section 45 comprises a low VHF amplifier 46 and a low VHF mixer 48. The RF section 45 receives its RF signal from a VHF antenna 50. When the band switch 40 is turned on by a band-switching signal on conductor 34, it applies $B^+$ voltage to the low VHF amplifier 46 and mixer 48 over a conductor 51, turning those circuits on, thus activating the RF section 45. As only one band switch is turned on at a time, the other RF sections 53 and 59 remain off. The received RF signal is amplified by the low VHF amplifier 46 and applied to the mixer 48. The output of the oscillator 32 is applied to the mixer 48 as a beating signal and beats against the amplified RF signal to produce an IF signal which is applied to a second mixer 52 for processing in a conventional manner.

The high VHF band RF section 53 comprises a high VHF amplifier 54 and a high VHF mixer 56. The high VHF amplifier 54 also receives its RF signal from the VHF antenna 50. A band-switching signal on the conductor 36 turns on the band switch 42, which in turn supplies $B^+$ voltage to the high VHF amplifier 54 and mixer 56 over a conductor 57 turning those circuits on, thus activating the RF section 53. As only one band switch is turned on at a time, the other RF sections 45 and 59 are turned off. The received RF signal is amplified by the high VHF amplifier 54 and applied to the mixer 56. For the high VHF band channels, a signal from the oscillator 32 is applied to a frequency-multiplying circuit 58 which operates to produce a frequency-multiplied signal at a multiple of the frequency of the oscillator 32. This frequency-multiplied signal is applied to the high band VHF mixer 56 as a beating signal and beats against the amplified RF signal to produce an IF signal which is applied to the second mixer 52 for processing in the usual manner.

The UHF band RF section 59 comprises a UHF amplifier 60 and a UHF mixer 62. The UHF amplifier 60 receives its RF signal from a UHF antenna 64. A band-switching signal on the conductor 38 turns on the band switch 44, which in turn applies $B^+$ voltage to the UHF amplifier 60 and mixer 62 over a conductor 65 turning those circuits on, thus activating the RF section 59. As only one band switch is turned on at a time, the other RF sections 45 and 53 are turned off. The received RF signal is amplified by the UHF amplifier 60 and applied to the mixer 62. At the same time, the band switch 44 applies $B^+$ voltage to a second frequency-multiplying circuit 66, turning that circuit on. The second frequency-multiplying circuit 66 produces a second frequency-multiplied signal at a multiple of the frequency of the first frequency-multiplied signal. The second frequency-multiplied signal is applied to the UHF mixer 62 as a beating signal and beats against the amplified RF signal to produce an IF signal. This IF signal is applied to the second mixer 52 for processing in the usual manner.

As only one of the band switches 40, 42 and 44 is turned on at any one time, the second mixer 52 receives an IF signal from but one of the respective RF sections 45, 53 and 59. A local oscillator 68 produces a second beating signal at a desired frequency. That signal is applied to the second mixer 52 and beats against the IF signal received. The output of the second mixer 52 is applied to a limiter-detector 70 which may be a conventional circuit operating in the usual way to produce an information signal. The information signal is generally an audio signal and may be applied to an audio amplifier 72 for driving a speaker 74.

At the same time the limiter-detector 70 produces a tuning signal which is applied to an automatic frequency control circuit 76. At least in the UHF band, the automatic frequency control circuit 76 operates to control the frequency of the oscillator 32 to keep the channel tuned to the selected frequency. The automatic frequency control is made operative only for the UHF band, being turned on only upon receipt of an enabling signal from the band switch 44.

The output of the limiter-detector 70 is also applied to a squelch circuit 78 which operates in a conventional manner to produce a positive control signal when an information signal is being received from the limiter-detector 70 and produces a 0 control signal when the information signal from the limiter-detector signal 70 becomes very small, indicating that the respective channel is not being received. The squelch control signal is inverted by an inverter 80, producing an inverted squelch control signal which is positive when the channel is not being received and 0 when the channel is being received. The inverted squelch control signal is applied to the audio amplifier 72 to turn off the audio amplifier 72 when the inverted squelch control signal indicates that no signal is being received. This may be achieved with well-known circuitry to prevent the audio amplifier 72 from responding to noise. At the same time, the inverted squelch control signal is applied to the automatic frequency control circuit 76 to turn off that circuit when no signal is being received to prevent that circuit from responding to noise. Also at the same time, the squelch control signal is applied to the clock 20 to inhibit the clock when a signal is being received, thus stopping the sequential switching circuit 24 once the sequential scanning reaches a channel that is being received.

In order that the clock not resume scanning in the event of a temporary loss of signal, the inverted squelch control signal is applied to a scan delay circuit 82 which provides a scan delay signal to the clock 20 keeping the clock stopped for a short predetermined period even though no signal is being received.

Considering the preferred circuit in greater detail, the clock 20 (FIG. 3) comprises a relaxation oscillator wherein a unijunction transistor 84 conducts each time the voltage on a capacitor 86 connected between its emitter and ground reaches the threshold voltage of conduction of the transistor 84. The capacitor 86 is connected in parallel with a capacitor 88 in series with a normally conducting transistor 90. The transistor 90 is in parallel with a diode 92. The capacitors 86 and 88 are charged from $B^+$ through a resistor 94 in series with a variable resistor 96. The upper base of the transistor 84 is connected to $B^+$ through a resistor 97 and the lower base of the transistor 84 is connected to ground through a resistor 98. The upper base is coupled to ground through a capacitor 99. When the voltage on the capacitors 86 and 88 reaches the threshold voltage, the transistor 84 conducts between its emitter and lower base discharging capacitors 86 and 88 through the resistor 98. This develops a positive pulse on the resistor 98 which is applied through a resistor 100 to the base of a transistor 102. The emitter of the transistor 102 is connected directly to ground, and the collector of the transistor 102 is connected to $B^+$ through a resistor 103. The transistor is therefor biased to be non-conducting in the absence of a positive voltage on the base. Thus, the positive pulse applied to the base turns on the previously non-conducting transistor 102. This drives the collector of the transistor 102 to ground potential. This produces a sharply decreased voltage that is applied through a capacitor 104 to the conductor 22 as a negative-going pulse.

The capacitor 88 is charged through the normally conducting transistor 90, the operation and function of which in a speed-up circuit will be discussed further below. The capacitor 88 is discharged through the diode 92. The period of the relaxation oscillator is determined by the time constant of the RC charging circuit comprising the resistors 94 and 96 and the capacitors 86 and 88. The time constant may be adjusted by adjusting the resistance of the variable resistor 96.

The relaxation oscillator comprising the clock 20 thus produces negative pulses periodically upon the conductor 22 until the clock 20 is stopped. As noted above, the clock is to be stopped whenever a signal is being received upon the selected channel. When a signal is being received, the squelch circuit 78 produces a positive squelch control signal. This positive squelch control signal is used to stop the clock by applying it over a conductor 105 through a resistor 106 to the clock circuit 20. There the positive squelch control signal is applied through a diode 108 to the base of a transistor 110. The emitter of the transistor 110 is connected directly to ground, and its collector is connected through a resistor 112 to the emitter of the unijunction transistor 84. The transistor 110 is thus biased to be normally non-conducting. Upon receipt of a positive squelch control signal the transistor 110 becomes conductive and connects the emitter of the unijunction transistor 84 to ground through the resistor 112. The resistance of the resistor 112 is low relative to the resistance of the resistors 94 and 96 and thus assures that the voltage on the emitter of the unijunction 84 does not rise above the threshold voltage of the transistor 84 during the course of the charging of the capacitors 86 and 88. This inhibits the operation of the clock 20, stopping the oscillation and the production of clock pulses through the conductor 22 to the sequential switching circuit 24.

The sequential switching circuit 24 comprises a binary counter and a binary-to-multiple line decoder/driver. As illustrated, a four-bit binary counter 114, which may be an integrated circuit (IC1) of the type SN7493N, acts when connected as shown to count negative pulses at its input terminal 14 and produce a signal indicative of the count in four-bit binary form on terminals 8, 9, 11 and 12. These four-bit binary signals are applied to a decoder/driver 116 which may comprise a pair of binary-to-decimal decoder/drivers 118 and 120. The output from terminal 11 of the four-bit binary counter 114 is inverted by an inverter 122 to provide an inverted signal for application to the binary-to-decimal decoder/driver 118. The binary-to-decimal decoder/drivers 118 and 120 may be integrated circuits (IC3 and IC2) of the type SN74145N. When connected as shown, the binary-to-decimal decoder/drivers 118 and 120 form a four-bit binary-to-16 line sequential decoder/driver 116 wherein upon each cycle of the four-bit binary counter 114, the 16 output leads from the decoder/driver 116 are successively grounded one at a time with the remaining leads at positive potential. Thus, so long as the relaxation oscillator comprising the clock 20 continues to operate, a ground-switching signal appears successively and sequentially on each of the 16 output leads 26.

Each of the output leads 26 is connected to a respective channel 1–16 of the crystal-switching array 28. In each channel of the crystal-switching array 28 the output lead 26 is connected to a manually operated bypass switch 124. When the switch 124 is connected as shown in FIG. 1 for channels 1–15, the switch is connected to activate the respective tuning crystal 30. When the bypass switch 124 is connected as shown for channel 16, that channel is bypassed, as will be discussed further below. When the switch 124 is in the position illustrated for channels 1–15, a switching signal on the respective lead 26 operates through an isolating impedance 126 (which may, as shown, be a resistor and inductor in series) to turn on a diode switch 128 which is biased by $B^+$ supplied from the oscillator 32 over a conductor 129 through a resistor 130. This couples the respective tuning crystal 30 into the tuning circuit of the oscillator 32. At the same time, the switching signal on the respective lead 26 turns on a respective channel-indicating lamp 132 in the crystal-switching array 28, which thus indicates when a respective tuning crystal is connected into the tuning circuit of the oscillator 32 and hence indicates to which channel the receiver is tuned. Also, for each channel the switch 124 when in the position illustrated for channels 1–15 connects the switching signal to a diode switch 134 which is connected to a band selector switch 136. The band selector switch 136 may, as shown, be placed manually in one of the three positions to connect the respective diode 134 to one of the three conductors 34, 36 and 38, all of which are positively biased so that upon receipt of a grounded switching signal on a respective lead 26, a respective diode 134 grounds one of conductors 34, 36 and 38 thus turning on the selected respective band switch 40, 42 or 44.

Figure 2:
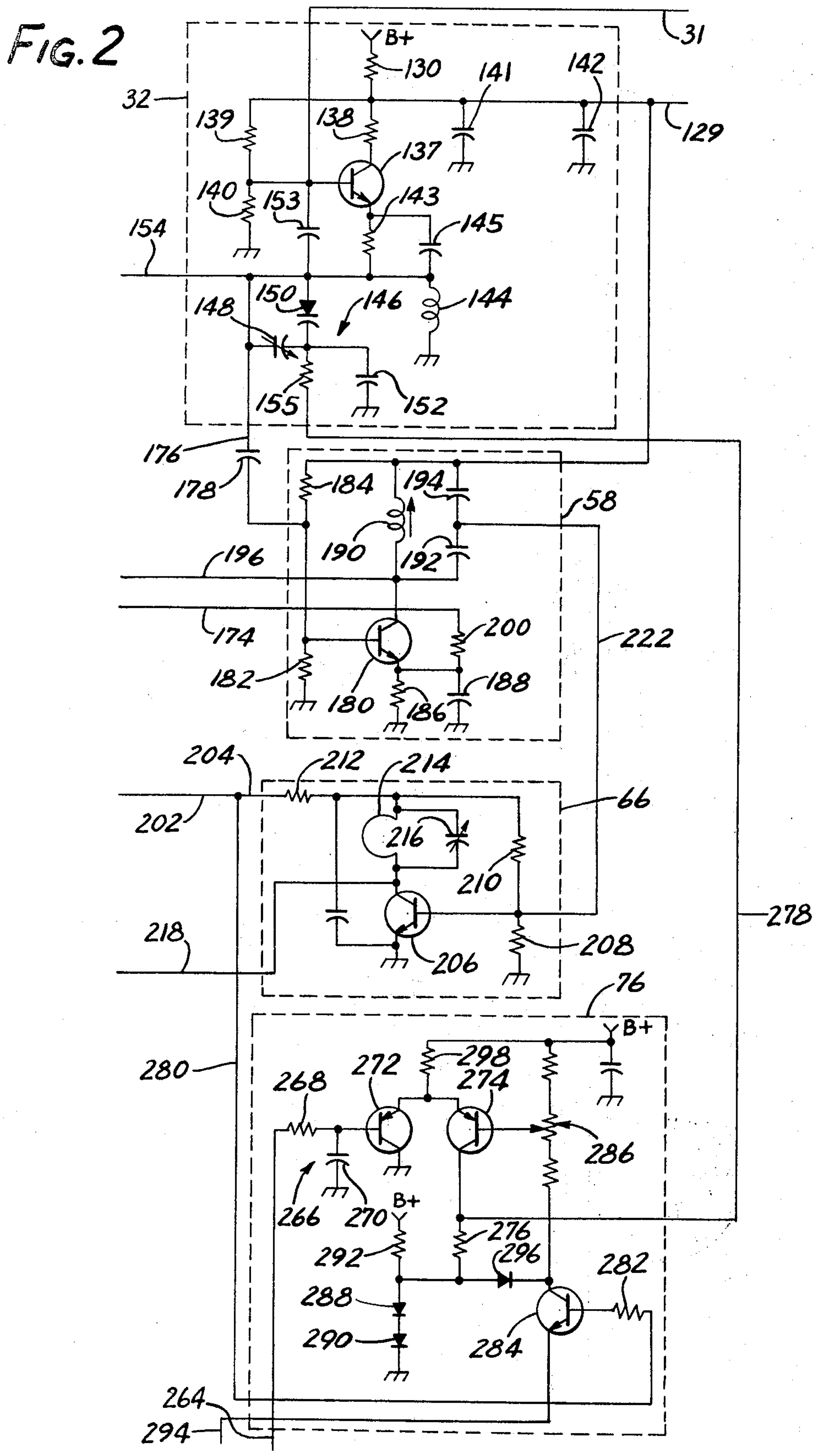
FIG. 2 is a diagrammatic illustration of one form of oscillator, frequency-multiplying and automatic frequency control circuits of the scanning radio receiver as illustrated in FIG. 1.

The oscillator 32 is a crystal oscillator into the tuning circuit of which a respective tuning crystal 30 is coupled by the operation of a respective diode switch 128 upon the application of a sequential switching signal on a respective output lead 26. As shown in FIG. 2, the oscillator 32 comprises a transistor 137 with its collector supplied with $B^+$ voltage through a resistor 138 connected between the collector and the resistor 130. The base of the transistor 137 is biased by the voltage developed at the junction between resistors 139 and 140 connected between ground and the junction between the resistors 130 and 138. One side of a respective tuning crystal 30 is coupled through the conductor 31 to the base of the transistor 137. The other side of the crystal 30 is coupled to ground through the respective diode switch 128, the conductor 129 and capacitors 141 and 142. The emitter of the transistor 137 is connected to one side of a resistor 143, the other side of which is coupled to ground through an inductor 144. A capacitor 145 is connected across the resistor 143. The output circuit of the oscillator 32 comprises the inductor 144 in parallel with a capacitance network 146 which comprises a variable capacitor 148 in parallel with a variable capacitance diode 150 with these in series with a capacitor 152. The output circuit is coupled through a capacitor 153 to the base of the transistor 137. The oscillator 32 produces output signals at the output circuit at a frequency primarily determined by the particular crystal 30 coupled into its tuning circuit. The frequency also depends upon the capacitance of the variable capacitance diode 150, which in turn depends upon the voltage applied thereto through a resistor 155 from the automatic frequency control circuit 76, as will be discussed in greater detail below. The output signals of the oscillator 32 are applied over a conductor 154 through a capacitor 156 to the low band VHF mixer 48.

Each of the band switches 40, 42 and 44 comprises a transistor 158 rendered conductive by a grounded switching signal on the respective conductor 34, 36 or 38. This applies $B^+$ voltage to the amplifier and mixer of the RF section of the respective band. At the same time each band switch 40, 42 and 44 includes a transistor 160 connected in series with a band-indicating lamp 162. The transistor 160 is rendered conductive upon conduction of the respective transistor 158 thereby turning on the respective band-indicating lamp 162. The switching signals from the respective conductors 34, 36 and 38 are applied through respective input resistors 164 to the bases of the respective transistors 158. In absence of such signals, the transistors 158 are held non-conductive by the application of $B^+$ voltage to the respective bases through respective resistors 166. Positive voltage is thus also supplied through resistors 164 and 166 over the respective conductors 34, 36 and 38 to supply appropriate bias for the diode switches 134. Upon conduction of a transistor 158, a signal is applied through a respective resistor 168 to the base of a respective transistor 160, thereby turning that transistor on. The respective lamp 162 is thereupon energized by current from a voltage source $V_c$ through a resistor 170. In the case of the band switch 40, the base of the transistor 160 is connected to ground through a resistor 172.

One of these band switches 40, 42 and 44 is energized each time a tuning crystal 30 is placed in the tuning circuit of the oscillator 32. Which band switch is operated is determined by the position of the respective band selector switch 136. As shown in FIG. 1, the band selector switches 136 for channels 1, 4, 5, 6 and 16 are set to turn on the band switch 40 for the low VHF band when the respective leads 26 are supplied with a switching signal. Similarly, the band selector switches 136 for channels 2, 7, 8, 9, 10 and 15 are set to turn on the high VHF band switch 42, and the band selector switches 136 for channels 3, 11, 12, 13 and 14 are set to turn on the UHF band switch 44.

The operation of the band switches 40, 42 and 44 and the corresponding operation in each band will be taken one after another. Channel 1 may be taken as representative of channels in the low VHF band. When a switching signal appears on the lead 26 to channel 1 of the crystal-switching array 28, the crystal for channel 1 is coupled into the tuning circuit of oscillator 32, and the band switch 40 for the low VHF band is energized. This activates the low VHF RF section 45 by turning on the low VHF band amplifier 46, mixer 48 and indicator lamp 162. At the same time the positive voltage on the conductor 51 is applied over a conductor 174 to disable the first frequency-multiplying circuit 58. The second frequency-multiplying circuit 66 and the automatic frequency control circuit 76 remain disabled, as do the high VHF and UHF RF sections 53 and 59. The receiver is thus tuned to a frequency in the low VHF band and an IF signal developed in the mixer 48 is applied to the second mixer 52.

Channel 2 may be taken as representative of channels in the high VHF band. In the case of channel 2, upon the receipt of a suitable switching signal on the respective lead 26 as the sequential switching circuit 24 proceeds to its next condition, the tuning crystal 30 for channel 2 is substituted for that of channel 1 in the tuning circuit of the oscillator 32 and the band switch 42 for the high VHF band is energized instead of the band switch 40 for the low VHF band. This disables the RF section 45 for the low VHF band and turns off the corresponding indicator lamp 162. Energization of the band switch 42 for the high VHF band activates the RF section 53 for the high VHF band by turning on the high VHF amplifier 54 and mixer 56 as well as the corresponding band indicator lamp 162. The turning off of band switch 40 also removes the disabling signal on the conductor 174 and therefore turns on the first frequency-multiplying circuit 58.

The first frequency-multiplying circuit 58 is shown to be a tripler circuit comprising a Class C amplifier which inherently introduces harmonics, notably the third harmonic, into its output signal. The tripler circuit 58 receives the output signal of the oscillator 32 over a conductor 176 through a coupling capacitor 178. The tripler circuit 58 comprises a transistor 180 biased by the potential developed upon a grounded resistor 182 connected to its base and supplied from the $B^+$ through a resistor 184 connected to the conductor 129. The emitter of the transistor 180 is coupled to ground through a resistor 186 and a capacitor 188 in parallel. The output of the tripler circuit 58 is developed in an output circuit comprising an inductor 190 in parallel with series-connected capacitors 192 and 194. This output circuit is connected between the collector of the transistor 180 and the $B^+$ voltage supplied to the conductor 129. The inductor 190 and capacitors 192 and 194 are tuned to a band of frequencies appropriate for mixing in the high VHF mixer 56. The output signal from the oscillator 32 is at a frequency providing a third harmonic in this band.

Thus, the first frequency-multiplied signal is developed on a conductor 196 connected to the output circuit at a frequency that is a multiple (the third) of the frequency of the oscillator output signal. The first frequency-multiplied signal is applied through a capacitor 198 to the high VHF mixer 56, where it beats with the amplified high VHF signal to produce the IF signal applied to the second mixer 52. The emitter of the transistor 180 is connected to the conductor 174 through a resistor 200 whereby, when band switch 40 for the low VHF band is turned off, the transistor 180 is permitted to conduct, but the transistor is disabled by a positive biasing voltage applied over the conductor 174 when the band switch 40 is turned on. Meanwhile, with only the band switch 42 for the high VHF band turned on, the second frequency-multiplying circuit 66 and the automatic frequency control 76 remain disabled, as does the RF section 59 for the UHF band. The receiver is thus tuned to a frequency in the high VHF band and an IF signal developed in the mixer 56 is applied to the second mixer 52.

Channel 3 may be taken as representative of channels in the UHF band. In the case of channel 3, upon the receipt of a suitable switching signal on the respective lead 26 as the sequential switching circuit 24 proceeds to its next position, the crystal 30 for channel 3 is coupled into the tuning circuit of the oscillator 32, and the band switch 44 for the UHF band is energized instead of the band switch 42 for the high VHF band. This disables the RF section for the high VHF band and turns off the corresponding indicator lamp 162. Energization of the band switch 44 for the UHF band activates the RF section 59 for the UHF band by turning on the UHF amplifier 60 and mixer 62 as well as the corresponding band indicator lamp 162. The band switch 44 also applies $B^+$ voltage over conductors 202 and 204 to energize the second frequency-multiplying circuit 66.

The second frequency-multiplying circuit 66 is also shown to be a tripler circuit comprising an amplifier inherently producing harmonics of the frequency of its input signal. The second tripler circuit 66 comprises a transistor 206 biased by the voltage developed across a resistor 208 connected between its base and its grounded emitter and forming part of a voltage divider also including resistors 210 and 212 connected to the $B^+$ voltage by conductors 204 and 202. The output signal is developed across an output circuit comprising an inductor 214 in parallel with a capacitor 216 connected between the collector of the transistor 206 and the junction of the resistors 210 and 212. The output circuit is tuned to frequencies in the UHF band. The tripler circuits 58 and 66 are cascaded in the sense that a first frequency-multiplied output signal derived at the junction of the capacitors 192 and 194 in the first tripler circuit 58 is supplied over a conductor 222 to the base of the transistor 206 of the second tripler circuit 66 which develops at its output circuit the second frequency-multiplied output signal at a multiple (the third) of the frequency of the first frequency-multiplied output signal. With the two cascaded tripler circuits, this develops a second frequency-multiplied output signal at the ninth harmonic of the frequency of the oscillator output signal. The output circuit of the tripler circuit 66 is tuned to a band of frequencies appropriate for mixing in the UHF mixer 62, which band encompasses the ninth harmonic of the oscillator frequency. This develops the ninth harmonic frequency for application over a conductor 218 and through a capacitor 220 to the UHF mixer 62 wherein it beats against the amplified RF signal to produce an IF signal which in turn is transmitted to the second mixer 52.

Thus, depending upon which band switch 40, 42 or 44 is turned on and which particular tuning crystal 30 is placed in the circuit, a signal is produced from one of the mixers 48, 56 and 62 and applied to the second mixer 52 where it is beat with the output of the local oscillator 68 to produce a low frequency IF signal which is applied to the limiter-detector 70 for demodulation in a usual manner. The output of the limiter-detector 70 includes an information signal (an audio signal) which is applied over conductors 224, 226 and 228 to the audio amplifier 72 where it is processed in the usual way to drive the speaker 74. At the same time, the information signal is applied over conductors 224 and 230 to the squelch circuit 78 which develops a positive squelch control signal as $B^+$ voltage on a conductor 232 when an information signal is present. This $B^+$ voltage operates through the conductor 105, the resistor 106 and the diode 108 to turn on the transistor 110 and stop the clock 20. Thus, the sequential switching circuit 24 switches from channel to channel sequentially at the rate of application of pulses from the clock 20 until it tunes in a channel which is being received, whereupon the $B^+$ voltage produced upon the conductor 105 stops the clock and inhibits the sequential switching circuit 24. This stops the scanning on that channel. In absence of received signal, the squelch control signal from the squelch circuit 78 is driven substantially to ground which renders the transistor 110 nonconductive except upon operation of the scan delay circuit 82.

The squelch control signal on the conductor 232 is inverted by the inverter 80 to produce an inverted signal on its output conductor 236. This inverted squelch control signal goes substantially to ground when the signal on the conductor 232 is at $B^+$ and substantially to $B^+$ when the signal on conductor 232 is substantially at ground. The inverted signal is applied over a conductor 238 to the scan delay circuit 82. When a channel is being received and $B^+$ appears on the conductor 105, ground appears on the conductor 238 at the input of the scan delay circuit 82. The scan delay circuit 82 thereupon produces a positive voltage at its output on a conductor 240 which, like the positive signal on the conductor 105, stops the operation of the clock 20. On the other hand, when no signal is being received, the output of the squelch control signal on the conductor 105 goes to ground and the inverted squelch control signal on the conductor 238 goes to $B^+$; the scan delay circuit 82 then produces a ground signal on the conductor 240, but only after a predetermined period of delay. Because of the delay, a positive voltage remains on the conductor 240 for the predetermined period after the voltage on the conductor 105 has gone to ground. As the signal on the conductor 240 is coupled directly through the diode 108 to the base of the transistor 110 whereas the signal on the conductor 105 is isolated from the diode 108 by the resistor 106, the signal on the conductor 240 overrides that on the conductor 105 and the clock remains stopped for the predetermined period. The result is that the sequential switching circuit 24 continues to be inhibited for this predetermined time following cessation of reception of a signal on the channel to which the receiver is tuned. This means that a signal may be momentarily stopped, as to permit callback on that channel, without having the scanning receiver advanced to the next channel. Thus, the receiver will remain tuned to a channel during the course of the several transmissions so long as the signal is not interrupted longer than the predetermined time, which may, for example, be 3 seconds.

Figures 3, 4:
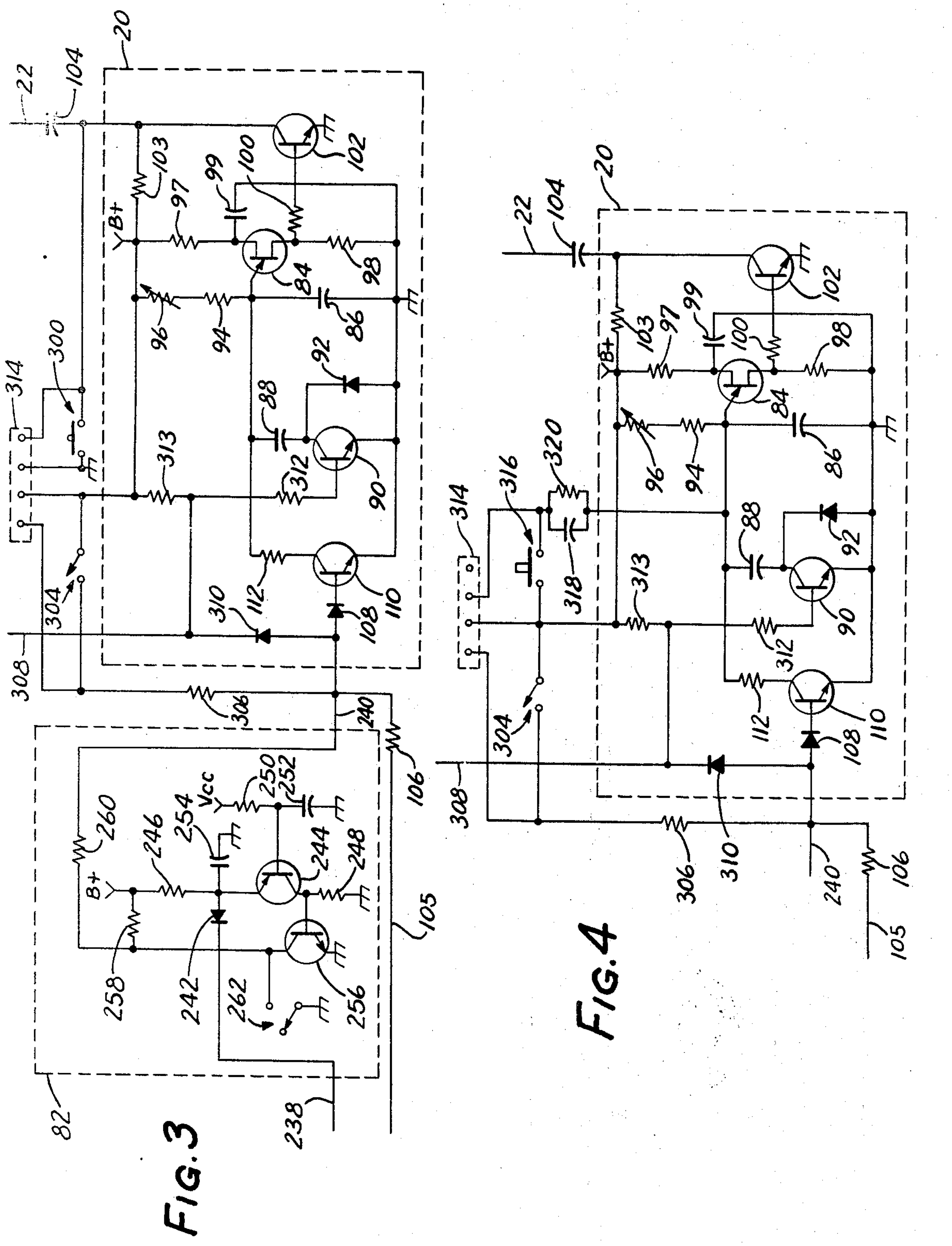
FIG. 3 is a diagrammatic illustration of one form of clock and scan delay circuits of the scanning radio receiver as illustrated in FIG. 1.
FIG. 4 is a diagrammatic illustration of a modified form of the clock circuit of the scanning receiver as illustrated in FIG. 1.

In the particular scan delay circuit 82 illustrated in FIG. 3, the input signal on the conductor 238 is applied through a diode 242 to the emitter of a transistor 244. The emitter is connected to $B^+$ voltage through a resistor 246. The collector of the transistor 244 is connected to ground through a resistor 248. Bias is supplied to the base of the transistor 244 from a voltage source $V_{cc}$ through a resistor 250. The base is also connected to ground through a capacitor 252. A capacitor 254 is connected from the emitter of the transistor 244 to ground. A transistor 256 is turned on and off by the potential developed across the resistor 248, which is applied to the base of the transistor 256. The emitter of the transistor 256 is connected to ground, and the collector of the transistor 256 is connected to $B^+$ through a resistor 258.

When a ground signal is applied to the scan delay circuit 82 over the conductor 238, as when a signal is being received, the capacitor 254 is discharged, reducing the voltage on the emitter of the transistor 244 below the bias applied to its base. This stops conduction through the transistor 244 and hence places the transistor 256 in the off state. The collector of the transistor 256 is coupled through a resistor 260 to the conductor 240. Thus, when the transistor 256 is off, the conductor 240 is connected to $B^+$ through the resistors 258 and 260 applying a positive voltage to turn on the transistor 110 and stopping the clock 20.

When the information signal is lost, the squelch control signal on the conductor 232 goes to ground and the inverted squelch control signal on the conductor 238 goes to $B^+$. This turns off the diode 242 and causes the capacitor 254 to be charged from $B^+$ through the resistor 246 until the potential developed on the capacitor 254 exceeds the bias voltage. Thereupon, the transistor 244 is turned on, in turn turning on the transistor 256. The conduction of transistor 256 is thus delayed for the predetermined time necessary to charge the capacitor 254 to the voltage necessary to overcome the bias. This predetermined time depends both on the bias voltage and the time constant of the charging circuit; however, typically a time of about 3 seconds may be selected. When the transistor 256 is turned on, the junction between the resistors 258 and 260 is grounded producing a ground potential on the conductor 240. This turns off the transistor 110 and starts the clock 20 after the predetermined delay.

A switch 262 may be provided to disable the scan delay circuit 82. When closed, it bypasses the transistor 256 keeping the junction between the resistors 258 and 260 at ground. This disables the scan delay circuit 82 in the sense that the conductor 240 will be at ground whenever a ground signal appears on the conductor 105, and the clock 20 will therefore be started immediately upon loss of the information signal.

In respect to automatic frequency control, the output of a conventional limiter-detector as utilized in the present circuit includes a direct current component indicative of the state of tuning of the oscillators 32 and 68. This direct current component is used as a tuning signal, for it is directly related to the deviation of the beat frequency from the respective mixer from its tuned condition. This tuning signal along with the information signal is applied over conductors 224, 226 and 264 to the input of the automatic frequency control circuit 76. The frequency control circuit 76 includes an input filter 266 comprising a series resistor 268 and a shunt capacitor 270. The filter 266 removes the information signal. The tuning signal is applied to an amplifier comprising transistors 272 and 274 and produces an output signal across an output resistor 276 which is applied over a conductor 278 and through the resistor 155 to the control terminal of the variable capacitance diode 150. This signal controls the capacitance of the variable capacitance diode 150 in such direction as to reduce the deviation of the tuning signal from its condition upon tuning, thus stabilizing the frequency.

Automatic frequency control is desirable principally on the UHF band because of the narrow band width of the transmitted signal relative to the high carrier frequency. Means is therefore provided to energize the automatic frequency control circuit 76 only when the UHF band is on. This is achieved by applying the $B^+$ voltage on conductor 202 over a conductor 280 through a resistor 282 to a base of the transistor 284. This turns the transistor 284 on only when the band switch 44 for the UHF band is on, for $B^+$ is applied to the conductor 202 only when that band switch is on. The collector of the transistor 284 is connected to $B^+$ through a voltage divider 286 which supplies bias to the base of the transistor 274. When the transistor 284 is off, the bias goes to $B^+$, turning off the transistor 274. Thus, the amplifier comprising transistors 272 and 274 is operative only when the band switch 44 turns on the transistor 284.

Were the emitter of the transistor 284 to be connected to ground, the automatic frequency control circuit 76 would operate as thus described. However, it is desirable that the automatic frequency control not operate when no signal is being received lest noise present on the conductor 224 cause the automatic frequency control circuit 76 to respond falsely and shift the frequency of the oscillator 32 so far as to cause severe distortion, low volume or even complete loss of signal. Therefore, the emitter of the transistor 284 is connected by a conductor 294 to the inverted squelch control output on the conductor 236. This grounds the emitter of the transistor 284 when an information signal is being received, rendering the transistor 284 conductive. However, in the absence of an information signal, $B^+$ voltage is developed on the conductor 294 which renders the transistor 284 non-conductive and disables the automatic frequency control circuit 76, much as the circuit is disabled when bias is not supplied to the base of the transistor 284 by the band switch 44. When the transistor 284 is in its conductive state, current through the transistor 274 and the resistor 276 passes through a diode 296 and thence through the transistor 284. The emitters of the transistors 272 and 274 are connected to $B^+$ through a resistor 298. The tuning signal is applied to the base of the transistor 272 and its collector is grounded. With this circuit, the automatic frequency control limits are set at one end by the ratio of the resistances of the resistors 298 and 276 and on the other end by the voltage drop of the diode 296.

In absence of an automatic frequency control signal developed across the resistor 276, the automatic frequency control 76 applies a voltage to the conductor 278 from the voltage developed across diodes 288 and 290 by current supplied from $B^+$ through a resistor 292. This standard control signal is such that the variable capacitance diode 150 operates to center the oscillator frequency in the controlled region. On the other hand, when a signal is received and the receiver stops scanning on a UHF channel, the automatic frequency control circuit 76 takes over and operates normally.

In order that another channel may be selected even though the scanning receiver is tuned to a receiving channel, a push button switch 300 is provided between ground and the collector of the transistor 102. Depression of the switch 300 grounds the collector and supplies a negative pulse to the conductor 22 causing the sequential switching circuit 24 to resume scanning. In the event that the direct connection of the collector to ground through the switch 300 is uncertain because contact bounce sometimes prevents positive closure, means may be provided to assure complete closure before a pulse is applied to the conductor 22. This may be achieved by inserting delay in application of the pulse to the conductor 22.

It may also from time to time be desirable to remain tuned to a station even though it stops broadcasting. To this end, a manually operated switch 304 is connected in series with a resistor 306 between $B^+$ and the conductor 240. When this switch is closed, the transistor 110 is turned on, thereby stopping the clock 20. In such condition, the sequential switching circuit 24 is advanced one step at a time by each successive depression of the push button switch 300.

It may from time to time be desirable to bypass a station even though it is broadcasting. This is the function of the switches 124. When a switch 124 of a particular channel is moved to the position shown for channel 16, a ground signal is applied to a conductor 308 whenever the sequential switching circuit 24 supplies a switching signal to that channel. This ground signal is applied through a diode 310 to the diode 108. However, the diode 310 is poled to block any positive signal on the conductor 308. Thus, a ground signal on the conductor 308 keeps the clock 20 on, bypassing the respective channel even though the receiver might otherwise have received a signal on that channel.

Additionally, means are provided to speed up the clock 20. As stated above, the transistor 90 is normally conducting, placing the capacitor 88 in parallel with the capacitor 86. The transistor 90 is normally biased to conduction by connecting its base to $B^+$ through resistors 312 and 313. The conductor 308 is connected to the junction between the resistors 312 and 313. When a channel is bypassed, the ground signal developed upon the conductor 308 is applied through the resistor 312 to the base of the transistor 90, turning off the transistor 90 and effectively taking the capacitor 88 out of the charging circuit for the relaxation oscillator. The capacitor 88 is made with substantially larger capacitance than that of the capacitor 86, so that when the capacitor 88 is taken out of the charging circuit, the time constant of the charging circuit is substantially reduced, as by a factor of 1,000. This causes the clock to produce a clock pulse almost instantaneously, advancing the sequential switching circuit 24 to its next state almost instantaneously. This makes for more rapid scanning of the channels and is particularly significant when it is desired to skip a large number of channels, the ultimate condition being monitoring but two channels. In that case, the sequential switching circuit rapidly bypasses all of the channels but the two being monitored.

For remote control operation, a terminal board 314 provides connections for remote switches in parallel with the switches 300 and 304.

Various modifications may be made in the various circuits within the scope of the present invention. For example, the manual advancement of the sequential switching circuit 24 may be achieved with the circuit illustrated in FIG. 4. As there illustrated, a negative pulse on the conductor 22 is produced by initiation of operation of the relaxation oscillator. A push button switch 316 is connected on one side to $B^+$ voltage and on the other side through a capacitor 318 to the emitter of the unijunction transistor 84. The relative capacitances of capacitor 318 and capacitors 86 and 88 are such that a sufficient portion of the $B^+$ voltage is promptly thereupon developed on the capacitors 86 and 88 to cause the unijunction 84 to conduct, producing a negative clock pulse on the conductor 22. A resistor 320 is connected in parallel with the capacitor 318 to serve to discharge the capacitor 318 when the push button switch 316 is released.

In an alternative embodiment, the resistance of the resistor 320 may be made sufficiently small relative to the resistance of the resistor 112 as to permit the flow of current through the resistor 320 to charge the capacitors 86 and 88 sufficiently to cause the unijunction 84 to conduct. In that event, the depression of the push button switch 316 causes the unijunction transistor 84 to conduct periodically and produce clock pulses on the conductor 22 until the push button switch 316 is released.

It has been noted above that the limiter-detector 70 produces an "information" signal which may be an audio signal processed both by the audio amplifier 72 and the squelch circuit 78. The squelch circuit provides a squelch control signal indicative of whether or not an audio signal is being received. It is also well known to provide a carrier-operated squelch where the squelch circuit identifies whether or not a carrier frequency is being received rather than whether or not an audio signal is being received. Of course, no audio signal is received when no carrier is transmitted, but a carrier may be received even though not modulated by an audio signal. For a carrier-operated squelch, the limiter-detector provides in a well-known manner what may also be designated an information signal varying with the IF signal and which may be processed by a conventional squelch circuit to provide a squelch control signal like that produced by the squelch circuit previously described and useful in the same way and for the same purposes as described above. In either system the squelch control signal may be said to indicate whether or not a station or channel is being received.

The various operating voltages may be supplied by conventional power supplies. These operating voltages are standard for the particular components used in the various circuits. $B^+$ may be +9 volts. $V_c$ may be +17 volts. $Vcc$ may be +5 volts.

Other variations may be made by those skilled in the art without departing from the spirit and scope of this invention.

What is claimed is:

1. A signal-seeking receiver which automatically scans a plurality of channels of respective predetermined radio frequencies lying in at least three separated limited bands of frequencies and tunes to a received signal having a frequency corresponding to one of said channels, said receiver including an RF section for each of said bands, each such RF section having a mixer, signal-generating means for applying beating signals to respective ones of said mixers, a plurality of frequency-determining crystals each corresponding to one of said predetermined frequencies, sequential switching means for automatically coupling successive ones of said frequency-determining crystals sequentially to said signal-generating means to produce beating signals at respective frequencies beating with said predetermined frequencies to tune in the respective channels, band-switching means for activating respective RF sections, band selector means associated with each such crystal for operating said band-switching means to activate the RF section for the band containing the predetermined frequency corresponding to the respective crystal, detection means coupled to said mixers for producing information signals when a channel tuned in is being received, and inhibiting means responsive to said information signals for inhibiting said sequential switching means when a channel tuned in is being received and stopping the scanning on a receiving channel, said signal-generating means comprising an oscillator having a tuning circuit into which respective successive ones of said frequency-determining crystals are coupled and producing an oscillator output signal at a frequency determined by the respective crystal coupled into its tuning circuit, a first frequency-multiplying circuit coupled to said oscillator and responsive to said oscillator output signal for producing a first frequency-multiplied output signal at a multiple of the frequency of said oscillator output signals, a second frequency-multiplying circuit coupled to said first frequency-multiplying circuit and responsive to said first frequency-multiplied output signal for producing a second frequency-multiplied output signal at a multiple of the frequency of said first frequency-multiplied output signal, and applying means for applying said oscillator output signal, said first frequency-multiplied output signal and said second frequency-multiplied output signal respectively to respective ones of said mixers, at least one of said first and second frequency-multiplying circuits comprising an amplifier stage separate from said oscillator, said receiver further including means for disabling said at least one of said frequency-multiplying circuits independently of said oscillator.

2. A receiver according to claim 1 wherein said first and second frequency-multiplying circuits are tripler circuits multiplying their respective input frequencies by three, and said second frequency-multiplying circuit comprises an amplifier stage separate from said oscillator.

3. A receiver according to claim 1 wherein there are three of said bands, said first frequency-multiplying circuit includes means coupled to said band-switching means for disabling said first frequency-multiplying circuit when the RF section for the band of lowest frequencies is activated, and said second frequency-multiplying circuit includes means coupled to said band-switching means for activating said second frequency-multiplying circuit when the RF section for the band of highest frequencies is activated.

4. A receiver according to claim 1 wherein said detection means produces a tuning signal systematically related to the deviation of the beat frequency from the respective mixer from its tuned condition, said signal-generating means includes an automatic frequency control circuit responsive to said tuning signal for producing a frequency control signal systematically related to said deviation from tuned condition, and said oscillator includes means responsive to said frequency control signal for changing the frequency of said oscillator output signals in such direction as to reduce said deviation, said receiver further including means coupled to said band-switching means for activating said automatic frequency control circuit only when th RF section for the band of highest frequencies is activated.

5. A receiver according to claim 4 including means responsive to said information signal for disabling said frequency control circuit when no information signal is being received.

6. A receiver according to claim 1 wherein said detection means produces a tuning signal systematically related to the deviation of the beat frequency from the respective mixer from its tuned condition, said signal-generating means includes an automatic frequency control circuit responsive to said tuning signal for producing a frequency control signal systematically related to said deviation from tuned condition, and said oscillator includes means responsive to said frequency control signal for changing the frequency of said oscillator output signals in such direction as to reduce said deviation, said receiver further including means responsive to said information signal for disabling said frequency control circuit when no information signal is being received.

7. A signal-seeking receiver which automatically scans a plurality of channels of respective predetermined radio frequencies lying in a plurality of separated limited bands of frequencies and tunes to a received signal having a frequency corresponding to one of said channels, said receiver including an RF section for each of said bands, each such RF section having a mixer, signal-generating means for applying beating signals to respective ones of said mixers, a plurality of frequency-determining crystals each corresponding to one of said predetermined frequencies, sequential switching means for automatically coupling successive ones of said frequency-determining crystals sequentially to said signal-generating means to produce beating signals at respective frequencies beating with said predetermined frequencies to tune in the respective channels, band-switching means for activating respective RF sections, band selector means associated with each such crystal for operating said band-switching means to activate the RF section for the band containing the predetermined frequency corresponding to the respective crystal, detection means coupled to said mixers for producing information signals when a channel tuned in is being received, and inhibiting means responsive to said information signals for inhibiting said sequential switching means when a channel tuned in is being received and stopping the scanning on a received channel, said detection means producing a tuning signal systematically related to the deviation of the beat frequency from the respective mixer from its tuned condition, and said signal generating means including an automatic frequency control circuit responsive to said tuning signal for producing a frequency control signal systematically related to said deviation from tuned condition, and an oscillator having a tuning circuit to which respective successive ones of said frequency-determining crystals are coupled and producing oscillator output signals at a frequency determined by the respective crystal coupled to its tuning circuit, said oscillator including a variable capacitance diode responsive to said frequency control signal for changing the frequency of said oscillator output signals in such direction as to reduce said deviation, said receiver further including means coupled to said band-switching means for activating said automatic frequency control circuit only when the RF section for the band of highest frequencies is activated, and bias means for fixing the capacitance of said diode in absence of said frequency control signal in the bands of lower frequencies.

* * * * *

UNITED STATES PATENT OFFICE
CERTIFICATE OF CORRECTION

Patent No. 3,824,475 Dated July 16, 1974

Inventor(s) Peter W. Pflasterer

It is certified that error appears in the above-identified patent and that said Letters Patent are hereby corrected as shown below:

ABSTRACT, last line, "turned" should be -- tuned --

Signed and sealed this 8th day of October 1974.

(SEAL)
Attest:

McCOY M. GIBSON JR.
Attesting Officer

C. MARSHALL DANN
Commissioner of Patents

RM PO-1050 (10-69)

USCOMM-DC 60376-P69
☆ U.S. GOVERNMENT PRINTING OFFICE : 1969 O—366-334.